(12) United States Patent
Fryda et al.

(10) Patent No.: US 10,662,538 B2
(45) Date of Patent: May 26, 2020

(54) METHOD FOR PRODUCING A DIAMOND ELECTRODE AND DIAMOND ELECTRODE

(71) Applicant: CONDIAS GMBH, Itzehoe (DE)

(72) Inventors: Matthias Fryda, Itzehoe (DE); Thorsten Matthée, Hohenaspe (DE)

(73) Assignee: CONDIAS GmbH, Itzehoe (DE)

( * ) Notice: Subject to any disclaimer, the term of this patent is extended or adjusted under 35 U.S.C. 154(b) by 0 days.

(21) Appl. No.: 15/576,320

(22) PCT Filed: May 25, 2016

(86) PCT No.: PCT/EP2016/061833
§ 371 (c)(1),
(2) Date: Nov. 22, 2017

(87) PCT Pub. No.: WO2016/189050
PCT Pub. Date: Dec. 1, 2016

(65) Prior Publication Data
US 2018/0142366 A1    May 24, 2018

(30) Foreign Application Priority Data

May 26, 2015 (DE) .......................... 10 2015 006 514

(51) Int. Cl.
| | | |
|---|---|---|
| *C01B 32/26* | (2017.01) | |
| *C01B 33/02* | (2006.01) | |
| *C25B 11/12* | (2006.01) | |
| *H01L 21/3213* | (2006.01) | |
| *H01L 21/78* | (2006.01) | |
| *H01L 33/00* | (2010.01) | |
| *H01S 5/02* | (2006.01) | |

(52) U.S. Cl.
CPC .............. *C25B 11/12* (2013.01); *C01B 32/26* (2017.08); *C01B 33/02* (2013.01); *H01L 21/32136* (2013.01); *H01L 21/78* (2013.01); *H01L 33/0095* (2013.01); *H01S 5/0201* (2013.01)

(58) Field of Classification Search
None
See application file for complete search history.

(56) References Cited

U.S. PATENT DOCUMENTS 5,776,323 A * 7/1998 Kobashi .............. C02F 1/46109
                                                    204/294
6,117,347 A * 9/2000 Ishida ..................... H01L 21/78
                                                    216/17
(Continued)

FOREIGN PATENT DOCUMENTS

CN     1735716 A    2/2006
CN     1324661 C    7/2007
(Continued)

*Primary Examiner* — Stephanie P Duclair
(74) *Attorney, Agent, or Firm* — W & C IP

(57) ABSTRACT

The invention relates to a method for producing a diamond electrode, which comprises the following steps: a) providing a main body (2) composed of silicon, the dimensions of which are greater than the dimensions of the diamond electrode (22) to be produced, b) etching at least one recess (10) into the surface of the main body (2), c) introducing predetermined breaking points (18) into the main body (2), d) coating the main body (2) with diamond, e) breaking the diamond electrode (22) out of the main body (2) along the predetermined breaking points (18).

11 Claims, 3 Drawing Sheets

(56) References Cited

U.S. PATENT DOCUMENTS

| | | | |
|---|---|---|---|
| 7,183,137 B2* | 2/2007 | Lee | B28D 5/00 |
| | | | 257/E21.599 |
| 2006/0144702 A1* | 7/2006 | Seki | C02F 1/46109 |
| | | | 204/280 |
| 2006/0216514 A1* | 9/2006 | Fujimura | C23C 16/27 |
| | | | 428/408 |
| 2009/0301865 A1* | 12/2009 | Yoshida | C02F 1/46109 |
| | | | 204/242 |
| 2013/0220214 A1* | 8/2013 | Noguchi | C30B 25/183 |
| | | | 117/103 |
| 2013/0313120 A1 | 11/2013 | De Sanoit et al. | |

FOREIGN PATENT DOCUMENTS

| | | | | |
|---|---|---|---|---|
| CN | 101316951 A | | 12/2008 | |
| DE | 695 03 285 T2 | | 11/1998 | |
| DE | 299 16 125 U1 | | 12/1999 | |
| DE | 100 25 167 A1 | | 12/2001 | |
| EP | 0 818 818 A1 | | 1/1998 | |
| EP | 1 953 271 A1 | | 8/2008 | |
| EP | 2 657 370 A1 | | 10/2013 | |
| GB | 2 483 769 A | | 3/2012 | |
| JP | 2006-010357 | * | 1/2006 | |
| JP | 2006-10357 A | | 1/2006 | |
| JP | 2011 046994 A | | 3/2011 | |
| JP | 2011046994 | * | 3/2011 | C25B 1/24 |
| JP | 2012 144779 A | | 8/2012 | |
| WO | 2014/095903 A1 | | 6/2014 | |

* cited by examiner

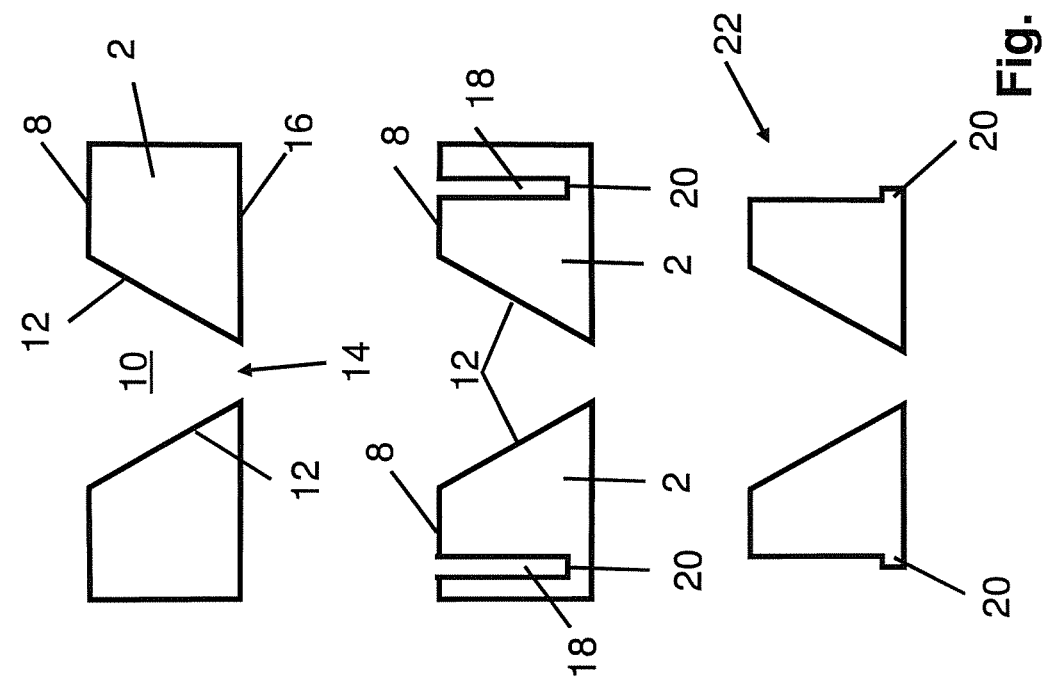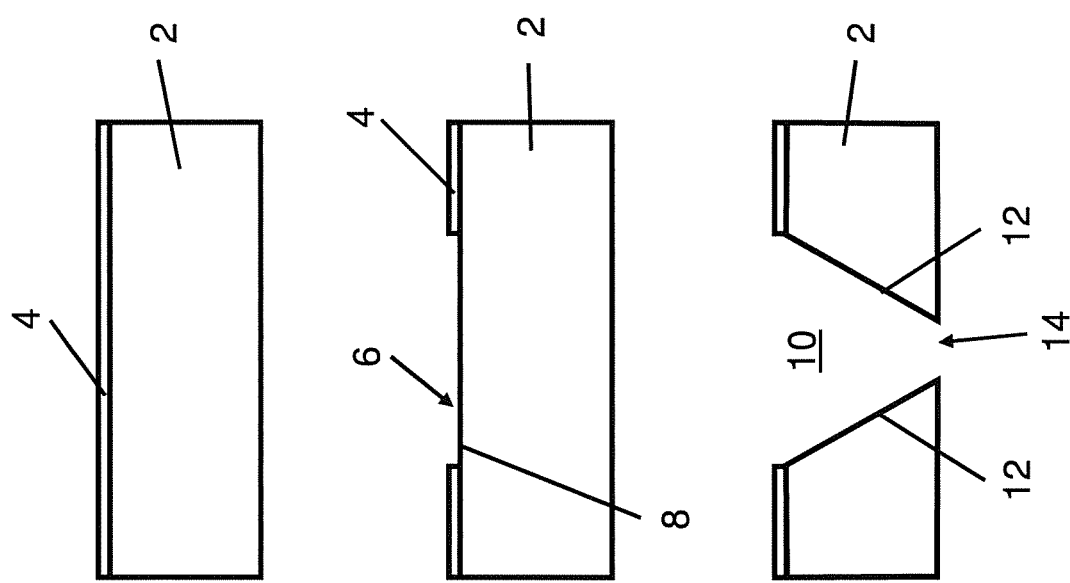

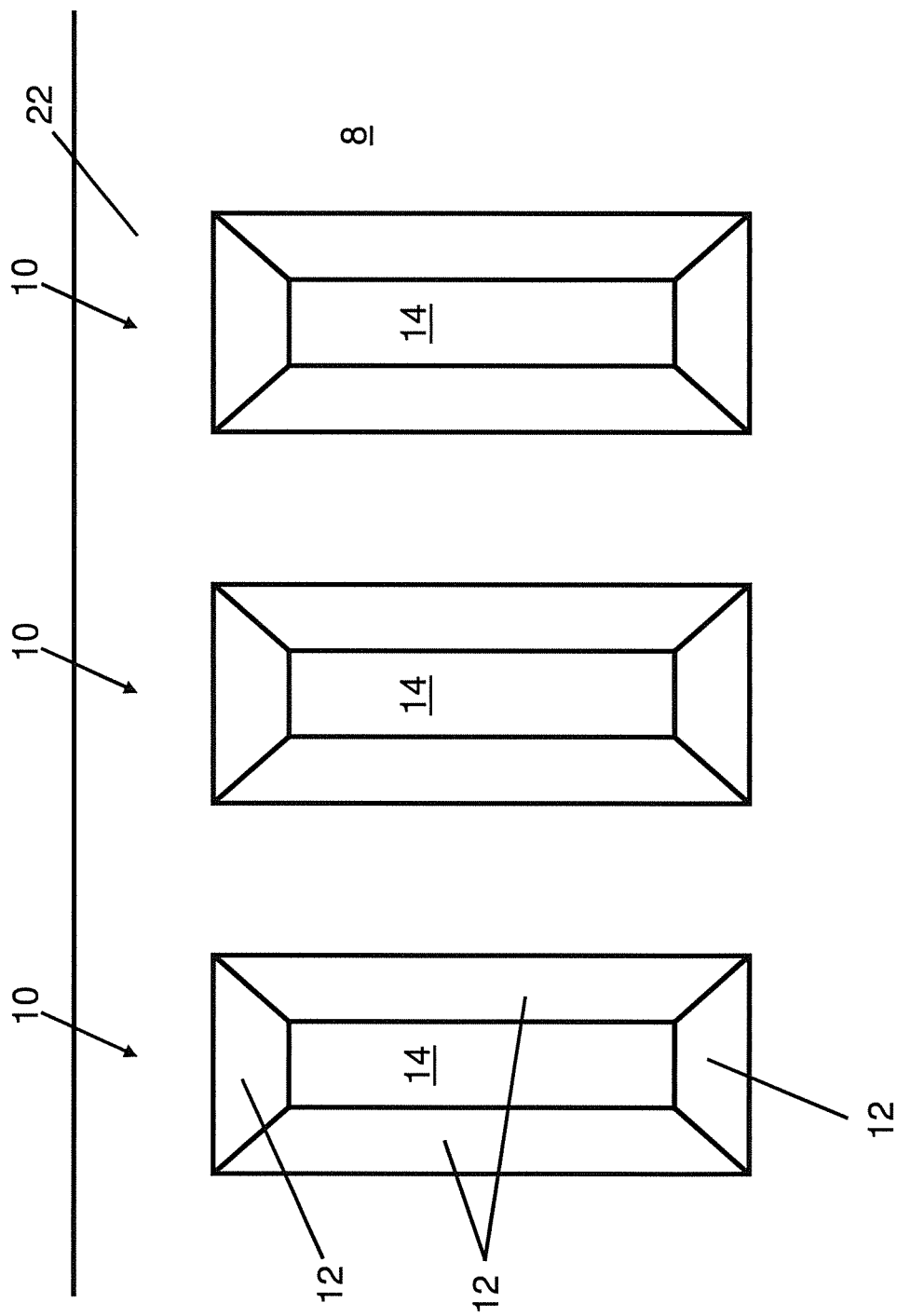

METHOD FOR PRODUCING A DIAMOND ELECTRODE AND DIAMOND ELECTRODE

FIELD OF THE INVENTION

The invention relates to a method for producing a diamond electrode and also to a diamond electrode producible by this method.

BACKGROUND

Diamond electrodes are today used especially in a multiplicity of different applications. In processor fabrication, a multiplicity of different layers with intricate structures are presently applied. To ensure proper functioning, the surfaces to be coated must generally be cleaned and conditioned. For each layer to be applied, an average of two to three cleaning and surface conditioning operations are performed. Different kinds of impurities here must be removed using different kinds of cleaning fluids. For organic impurities, for example, ozonized water is used, whereas particles disposed on the surface are removed using cathodic water. Anodic water, for example, is used to remove metallic impurities. In order to remove surfaces and final impurities, it is also possible for a special anodic water to be used that contains a mixture of dilute hydrofluoric acid and ozone.

For the production of all these cleaning solutions, diamond electrodes in corresponding electrode arrangements can nowadays be used.

Diamond electrodes can consist of solid single crystals of diamond, but in this embodiment are very expensive. Known practice in the prior art, therefore, is to produce diamond electrodes from a base material which is coated with a thin layer of diamond. The base material used here is often a metal, so that the currents needed to produce the various cleaning solutions can be conducted effectively to the electrode surface.

A disadvantage, however, is that metal electrodes merely coated with a layer of diamond harbor the risk of metallic impurities occurring in the cleaning solution. Moreover, metallic materials can be machined with the requisite accuracy only using very elaborate methods which, correspondingly, are cost-intensive.

SUMMARY

It is an object of the invention, therefore, to propose a method for producing a diamond electrode that can be carried out inexpensively and precisely and that is also suitable for the production of diamond electrodes in large quantities.

The invention achieves the stated object by means of a method for producing a diamond electrode, comprising the following steps:
 a) providing a base body of silicon, having dimensions greater than those of the diamond electrode to be produced,
 b) etching at least one recess into a surface of the base body,
 c) making predetermined breaking points in the base body,
 d) diamond-coating the base body,
 e) breaking the diamond electrode out of the base body along the predetermined breaking points.

Surprisingly, it has emerged that silicon is a suitable material for the base body of a diamond electrode, despite being a semiconductor and therefore having a band gap. This gap, particularly at low voltages, normally prevents current flow, and so silicon to start with looks not to be suitable as base material. It is known practice to increase the conductivity of the silicon by means of doping. Such highly doped silicon, however, is very difficult to subject to controlled etching, and so improving the conductivity results in a deterioration in the processing qualities. Surprisingly, however, there is no need for such doping. It has emerged that the diamond coating applied to the outside of the base body is sufficient to transport the required electrical currents. With this surprising finding, it is now possible to employ the processing and fabricating operations which are known from semiconductor technology and which are already highly optimized and suitable for mass production.

Advantageously, first of all, an adhesion layer of silicon dioxide ($SiO_2$) with a thickness of about 50 nm is applied to the base body of silicon. This layer serves as an adhesion promoter for an insulating layer for subsequent application, which may be 150 nm thick, for example, and which consists preferably of silicon nitride ($Si_3N_4$). Atop this layer, in a known method, a photoactive layer is applied and is subsequently exposed. This exposure can take place via conventional methods, of the kind known to the skilled person as mask exposure methods, for example.

An ion etching method, which is likewise known, is used to remove the insulating layer and the adhesion layer, so that the material of the base body is freely accessible at the exposed locations. All of this serves as preparation for the etching process proper in method step b). The etching itself takes place advantageously with an aqueous solution of potassium hydroxide (KOH). The residues of the applied adhesion layer and of the insulating layer are then removed. This can be done, for example, by etching with dilute hydrofluoric acid (HF). When the etching operation is concluded, predetermined breaking points are made in the base body before the latter is diamond-coated. After the base body has been coated with the diamond layer, the base body is broken along these predetermined breaking points. Here it is possible to produce one or more diamond electrodes simultaneously from the same base body, thereby simplifying mass production and allowing the corresponding production method to be carried out more cost-effectively.

The base body advantageously is a single crystal of silicon. Single crystals of this kind are nowadays used in large quantities in the semiconductor industry, for example, and are available on the market at correspondingly favorable costs.

In one preferred embodiment, the at least one recess possesses at least one flank which extends along a predetermined crystal plane of the base body. It has emerged that different crystal lattice planes in the single-crystal silicon exhibit different etching rates. For monocrystalline silicon, for example, it has been determined that the (111) plane can be etched approximately 400 times more slowly than the (100) plane. In this way it is possible to etch flanks which have an angle of inclination fixedly predetermined by the crystal structure of the material used, and which are therefore producible with great precision in a particularly simple way.

Preferably the at least one recess possesses a plurality of, preferably four, flanks of which a plurality, preferably all, extend along a predetermined crystal plane. In this way it is possible to produce not only the angle of inclination of a flank, but rather the angle of inclination, simply and precisely.

It has emerged as being advantageous that the predetermined crystal planes are <111> planes. This notation is used presently to describe the amount of the space diagonal planes of the crystal structure. Each of the crystal planes thus designated is therefore one of the eight possible space diagonal planes. A single crystal of silicon is present in the diamond structure, i.e., a face-centered cubic lattice. In crystallographic terms, accordingly, the eight space diagonal planes are equivalent. It is therefore possible to produce even those flanks of the recess that extend in different directions in such a way, by means of etching operations, that they extend along these planes.

It has emerged as being advantageous if the at least one recess forms an aperture through the base body. In this way the base body can later on be washed around well by the fluid which is to be used for electrochemical treatment of the electrode. Moreover, particularly on the underside, at which the aperture is completed by the etching, starting from the top side, sharp edges are produced which have a very small radius of curvature. It is at this location, accordingly, that at least a majority of the electrochemical treatment and of the accompanying reactions takes place. If the at least one recess is designed as an aperture, the fluid for electrochemical treatment is able to flow along easily at this location as well.

With preference a plurality of recesses, which with particular advantage are identical in design, are etched simultaneously into the surface of the base body.

In one preferred embodiment of the method, the predetermined breaking points are sawn into the base body. They consist accordingly, in particular, of a reduction—substantial if desired—in thickness. It has been found to be advantageous if the thickness of the base body at the predetermined breaking point is reduced to a maximum of 30%, advantageously of 20% and more advantageously of 10%, of the thickness of the base body before the predetermined breaking points are made. The lower the residual thickness, the easier it is for the diamond electrode to be broken out of the base body later on. However, there is an increase in the susceptibility toward vibrations and impacts during the production process.

Preferably a thickness of the base body is reduced to a predetermined value before the base body is diamond-coated. It has been found to be advantageous to treat the base body up to this point in time in a thickness which corresponds to the thickness used customarily in the semiconductor industry. In this way it is possible to employ the methods that are optimized for semiconductor technology, and the apparatus and machinery needed to implement the methods, without a need for expensive redevelopments, customizations or other alterations. Possibly, however, a diamond electrode is needed whose thickness is lower than the original thickness of the base body. In this case the thickness can be reduced to the predetermined value over the whole area. This can be done, for example, by grinding processes.

The invention further achieves the stated object by means of a diamond electrode which is producible by one of the methods described herein.

BRIEF DESCRIPTION OF THE DRAWINGS

An exemplary embodiment of the present invention is elucidated in more detail below with the aid of the appended figures, in which FIG. 1—shows various stages in the implementation of a method according to a first exemplary embodiment of the present invention, FIG. 2—shows a number of as yet unseparated diamond electrodes, and FIG. 3—shows an enlarged detail of a diamond electrode.

DETAILED DESCRIPTION

Figure 2:
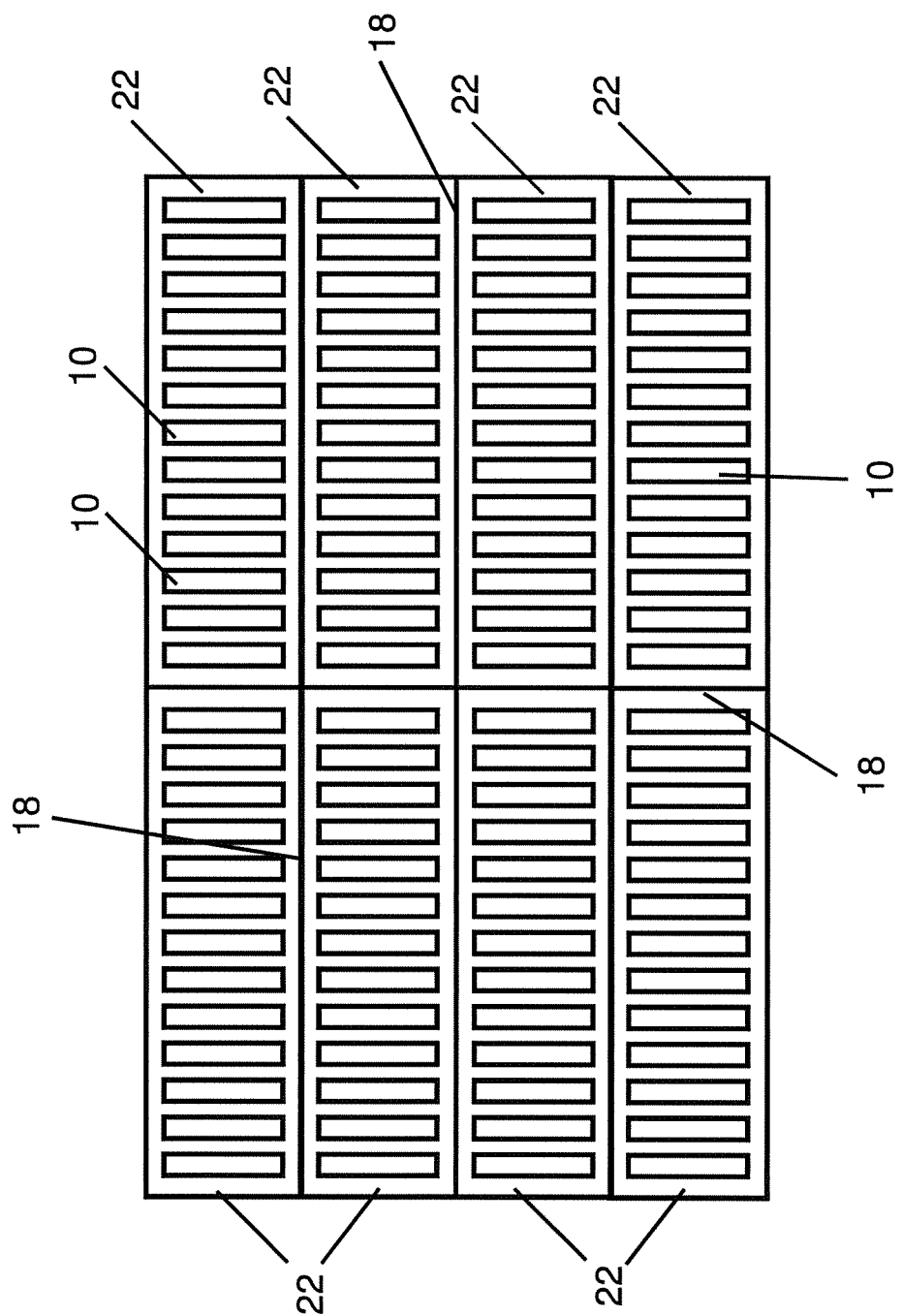

FIG. 1 shows various steps in the implementation of a method according to a first exemplary embodiment of the present invention. In the exemplary embodiment shown, a photoactive layer 4 has been applied first of all to a base body 2. Prior to this it may be necessary for further layers, as for example an adhesion layer made of silicon dioxide ($SiO_2$) and/or an insulating layer, consisting advantageously of silicon nitrite ($Si_3N_4$), to be applied to the base body 2, which consists of silicon. These further layers are necessary or advantageous, depending on the photoactive layers used, but for reasons of clarity have not been shown in FIG. 1. The base body 2 with the photoactive layer 4 applied thereto is shown in the top left-hand image in FIG. 1.

In the image shown below that, the photoactive layer 4 has been processed, by exposure, for example. It therefore has a gap 6 in which a surface 8 of the base body 2 is freely accessible.

The bottom left-hand representation from FIG. 1 shows the situation after at least one recess 10 has been etched into the base body 2. This can be accomplished for example by means of aqueous potassium hydroxide solution (KOH). Because of the particular properties of the base body 2 made of silicon, the recess 10 possesses flanks 12 which extend along predetermined crystal planes. In the case of silicon, different crystal planes can be removed with differing degrees of ease by etching. Because the flanks 12 extend along predetermined crystal planes, the angle of inclination of the flank 12 relative to the top side 8 or the opposite underside of the base body 2 can be fabricated and reproduced with great precision. In the exemplary embodiment shown, the recess 10 is continuous and therefore generates an aperture 14 through the base body 2.

In the next method step, the outcome of which is shown at the top right in FIG. 1, layers applied to the base body 2 are removed. This can be done, for example, by an operation of etching with dilute hydrofluoric acid (HF). Additionally to this it is possible for a height or thickness of the base body 2, defined by the distance between the surface 8 and the opposite underside 16, to be reduced to the desired degree. This can be accomplished, for example, via grinding devices.

Subsequently, predetermined breaking points 18 are made in the base body 2, thus producing the picture shown in the right-hand middle representation in FIG. 1. The predetermined breaking points 18 may for example be sawn as recesses into the surface 8 of the base body 2, leaving only a small web 20 of the silicon of the base body 2. Only after this step, advantageously, is the base body 2 diamond-coated. This is accomplished by way of methods which are known and conventional from the prior art. The diamond electrode 22 can subsequently be separated, by breaking the webs 20 at the predetermined breaking points 18. As a result, the diamond electrode 22 is broken out and separated.

FIG. 2 shows the representation of eight diamond electrodes 22 which have not yet been separated. The method steps already described may be carried out, for example, on a silicon wafer, which may have a diameter of 200 mm, for example. A multiplicity of electrodes can be produced from a wafer of this kind, and can be separated not until the last method step by breaking of the predetermined breaking points 18. In FIG. 2 it is seen that each of the diamond electrodes shown has a multiplicity of recesses 10. In the exemplary embodiment shown, all of the diamond electrodes 22 are designed with the same number and arrangement of recesses 10. This may be an advantage, but is not necessary. It is entirely possible to provide different positioning and different numbers of recesses 10 for different diamond electrodes 22, something which may be achieved, for example, in a particularly simple way by using different masks for the exposure of the photoactive layer 4. Located between the diamond electrodes 22 shown in FIG. 2 there are already predetermined breaking points 18, which have been sawn or made otherwise into the surface of the wafer. Along these predetermined breaking points 18, the base body 2 can be broken apart, and the individual diamond electrodes 22 separated.

FIG. 3 shows an enlarged detail of a plan view of the surface 8 of a diamond electrode 22. The figure shows three recesses 10, each possessing four flanks 12, which have been formed by etching of the recesses 10. In the exemplary embodiment shown in FIG. 3 as well, the depth of the recesses 10 is such that they form apertures 14, shown centrally between the flanks 12. The flanks 12 extend along predetermined crystal planes of the single crystal of silicon, which is used advantageously as a base body 2 for the diamond electrode 22. The angles of inclination can therefore be fabricated very precisely and reproducibly, and so the fabrication and production of large quantities of the electrodes is also possible in a very simple and yet exact way.

LIST OF REFERENCE NUMERALS

2 Base body
4 Photoactive layer
6 Gap
8 Surface
10 Recess
12 Flank
14 Aperture
16 Underside
18 Predetermined breaking point
20 Web
22 Diamond electrode

The invention claimed is:

1. A method for producing a diamond electrode, comprising the following steps:
   a) providing a base body of silicon, having dimensions greater than those of the diamond electrode to be produced,
   b) etching at least one recess into a surface of the base body,
   c) making predetermined breaking points in the form of recesses in the surface of the silicon of the base body, the at least one etched recess being separate from the predetermined breaking points,
   d) diamond-coating the base body after step c), then
   e) breaking the diamond electrode out of the base body along the predetermined breaking points.

2. The method as claimed in claim 1, wherein the base body is a single crystal of silicon.

3. The method as claimed in claim 2, wherein the single crystal of silicon is undoped at the diamond-coating step.

4. The method as claimed in claim 1, wherein the at least one recess has at least one flank which extends along a predetermined crystal plane of the base body.

5. The method as claimed in claim 4, wherein the predetermined crystal planes are the <111> planes.

6. The method as claimed in claim 1, wherein the at least one recess has a plurality of flanks which extend along a predetermined crystal plane.

7. The method as claimed in claim 6, wherein the predetermined crystal planes are the <111> planes.

8. The method as claimed in claim 1 wherein the at least one recess forms an aperture through the base body.

9. The method as claimed in claim 1 wherein the at least one recess includes a plurality of recesses identical in design and wherein the plurality of recesses are etched simultaneously into the surface of the base body during the etching step.

10. The method as claimed in claim 1 wherein the step of making the predetermined breaking points is performed by sawing the predetermined breaking points into the base body.

11. The method as claimed in claim 1 further comprising reducing a thickness of the base body to a predetermined value before the predetermined breaking points are made.

* * * * *